United States Patent
Camillo-Castillo et al.

(10) Patent No.: US 11,152,467 B2
(45) Date of Patent: Oct. 19, 2021

(54) EXTRINSIC BASE DOPING FOR BIPOLAR JUNCTION TRANSISTORS

(71) Applicant: International Business Machines Corporation, Armonk, NY (US)

(72) Inventors: Renata Camillo-Castillo, Essex Junction, VT (US); David L. Harame, Essex Junction, VT (US); Qizhi Liu, Lexington, MA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/516,803

(22) Filed: Jul. 19, 2019

(65) Prior Publication Data

US 2019/0341454 A1    Nov. 7, 2019

Related U.S. Application Data

(62) Division of application No. 14/749,836, filed on Jun. 25, 2015, now Pat. No. 10,431,654.

(51) Int. Cl.
*H01L 29/10* (2006.01)
*H01L 21/225* (2006.01)
(Continued)

(52) U.S. Cl.
CPC ...... *H01L 29/1004* (2013.01); *H01L 21/2257* (2013.01); *H01L 21/324* (2013.01);
(Continued)

(58) Field of Classification Search
CPC .............. H01L 29/73; H01L 29/66272; H01L 29/7317; H01L 29/737; H01L 29/7378; H01L 21/8249; H01L 27/0623; H01L 29/0649; H01L 29/7322; H01L 21/28518; H01L 29/0804; H01L 29/456; H01L 29/66242; H01L 29/7371; H01L 21/2257;
(Continued)

(56) References Cited

U.S. PATENT DOCUMENTS

| 4,495,512 A | 1/1985 | Isaac et al. |
| 5,098,638 A | 3/1992 | Sawada |

(Continued)

OTHER PUBLICATIONS

Kiyota, Y., et al., "Ultra-Thin-Base Si Bipolar Transistor Using Rapid Vapor-Phase Direct Doping (RVD)" IEEE Transactions on Electron Devices, Sep. 1992, p. 2077-2081, vol. 39, No. 9, United States.

(Continued)

*Primary Examiner* — Mark W Tornow
*Assistant Examiner* — Priya M Rampersaud
(74) *Attorney, Agent, or Firm* — Sherman IP LLP; Kenneth L. Sherman; Hemavathy Perumal

(57) ABSTRACT

A device structure for a bipolar junction transistor includes a base layer made of a semiconductor material. An emitter is disposed on a first portion of the base layer. A dopant-containing layer is disposed on a second portion of the base layer. A hardmask is disposed on the base layer. The hardmask includes a window aligned with the second portion of the base layer. Deposits of the dopant-containing layer are limited to exposed surfaces of: the first portion that is disposed on a top surface of the base layer inside of the window.

8 Claims, 5 Drawing Sheets

(51) Int. Cl.
  *H01L 21/324* (2006.01)
  *H01L 29/06* (2006.01)
  *H01L 29/08* (2006.01)
  *H01L 29/66* (2006.01)
  *H01L 29/737* (2006.01)
  *H01L 29/732* (2006.01)

(52) U.S. Cl.
  CPC ...... *H01L 29/0653* (2013.01); *H01L 29/0821* (2013.01); *H01L 29/66242* (2013.01); *H01L 29/7371* (2013.01); *H01L 29/66234* (2013.01); *H01L 29/732* (2013.01)

(58) Field of Classification Search
  CPC ............... H01L 21/324; H01L 29/1004; H01L 29/66234; H01L 29/0653; H01L 29/0821; H01L 29/732; H01L 21/2254
  See application file for complete search history.

(56) References Cited

U.S. PATENT DOCUMENTS

| | | | |
|---|---|---|---|
| 6,864,560 B2 | 3/2005 | Khater et al. | |
| 6,893,931 B1 | 5/2005 | Howard et al. | |
| 7,084,485 B2* | 8/2006 | Kirchgessner | H01L 21/8249 |
| | | | 257/559 |
| 7,358,546 B2 | 4/2008 | Sato et al. | |
| 7,679,164 B2* | 3/2010 | Pagette | H01L 29/66242 |
| | | | 257/576 |
| 7,687,887 B1 | 3/2010 | El-Diwany et al. | |
| 8,405,127 B2* | 3/2013 | Chu | H01L 29/7378 |
| | | | 257/197 |
| 8,409,959 B2 | 4/2013 | El-Kareh et al. | |
| 10,431,654 B2 | 10/2019 | Camillo-Castillo et al. | |
| 2004/0061129 A1 | 4/2004 | Saxler et al. | |
| 2005/0199908 A1 | 9/2005 | Geiss et al. | |
| 2007/0161216 A1 | 7/2007 | Bauer | |
| 2007/0235762 A1* | 10/2007 | Pagette | H01L 29/7378 |
| | | | 257/198 |
| 2011/0147793 A1* | 6/2011 | Chiu | H01L 29/7378 |
| | | | 257/156 |
| 2011/0198671 A1 | 8/2011 | Boccardi et al. | |
| 2012/0061802 A1 | 3/2012 | Nicholas et al. | |
| 2012/0064688 A1 | 3/2012 | Chen et al. | |
| 2013/0207235 A1 | 8/2013 | Faucher et al. | |
| 2013/0313677 A1* | 11/2013 | Qian | H01L 29/737 |
| | | | 257/499 |
| 2015/0008446 A1 | 1/2015 | Losee et al. | |
| 2015/0108549 A1* | 4/2015 | Benoit | H01L 29/732 |
| | | | 257/197 |
| 2015/0357447 A1* | 12/2015 | Adkisson | H01L 29/7378 |
| | | | 257/586 |
| 2016/0043203 A1* | 2/2016 | Alperstein | H01L 29/41708 |
| | | | 257/51 |
| 2016/0049492 A1* | 2/2016 | Greco | H01L 29/0804 |
| | | | 257/526 |

OTHER PUBLICATIONS

Nanver, L.K. et al., "Pure Dopant Deposition of B and Ga for Ultrashallow Junctions in Si-based Devices," ECS Transactions, The Electrochemical Society, 49(1) 25-33, 2012.

Sarubbi, F., thesis entitled, "Characterization of pure boron depositions integrated in silicon diodes for nanometer-deep junction applications," 2010, p. 1-186, The Netherlands.

Nanver, L.K., et al., "Pure-Boron Chemical-Vapor-Deposited Layers: a New Material for Silicon Device Processing," 18th IEEE Conference on Advanced Thermal Processing of Semiconductors—RTP, 2010, pp. 1-4, IEEE, United States.

Knezevic, T. et al., "Modelling of Electrical Characteristics of Ultrashallow Pure Amorphous Born p+n Junctions," MIPRO 2012, May 21-25 2012, pp. 36-41, Opatijia, Croatia.

List of IBM Patents or Patent Applications Treated as Related Form: Camillo-Castillo, R. et al., U.S. Appl. No. 14/749,836, filed Jun. 25, 2015; Camillo-Castillo, R. et al., U.S. Appl. No. 16/516,815, filed Jul. 19, 2019.

* cited by examiner

EXTRINSIC BASE DOPING FOR BIPOLAR JUNCTION TRANSISTORS

BACKGROUND

Bipolar junction transistors may be found, among other end uses, in high-frequency and high-power applications. In particular, bipolar junction transistors may find specific end uses in amplifiers for wireless communications systems and mobile devices, switches, and oscillators. Bipolar junction transistors may also be used in high-speed logic circuits. Bipolar junction transistors are three-terminal electronic devices that include an emitter, an intrinsic base, and a collector defined by regions of different semiconductor materials. In the device structure, the intrinsic base situated between the emitter and collector. An NPN bipolar junction transistor may include n-type semiconductor material regions constituting the emitter and collector, and a region of p-type semiconductor material constituting the intrinsic base. A PNP bipolar junction transistor includes p-type semiconductor material regions constituting the emitter and collector, and a region of n-type semiconductor material constituting the intrinsic base. In operation, the base-emitter junction is forward biased and the base-collector junction is reverse biased. The collector-emitter current may be controlled by the base-emitter voltage.

Improved fabrication methods and device structures are needed for a bipolar junction transistor.

SUMMARY

In one embodiment, a device structure for a bipolar junction transistor includes a base layer made of a semiconductor material. An emitter is disposed on a first portion of the base layer. A dopant-containing layer is disposed on a second portion of the base layer. A hardmask is disposed on the base layer. The hardmask includes a window aligned with the second portion of the base layer. Deposits of the dopant-containing layer are limited to exposed surfaces of: the first portion that is disposed on a top surface of the base layer inside of the window.

BRIEF DESCRIPTION OF THE DRAWINGS

The accompanying drawings, which are incorporated in and constitute a part of this specification, illustrate various embodiments and, together with a general description of the embodiments given above and the detailed description of the embodiments given below, serve to explain the embodiments.

DETAILED DESCRIPTION

Figure 1:
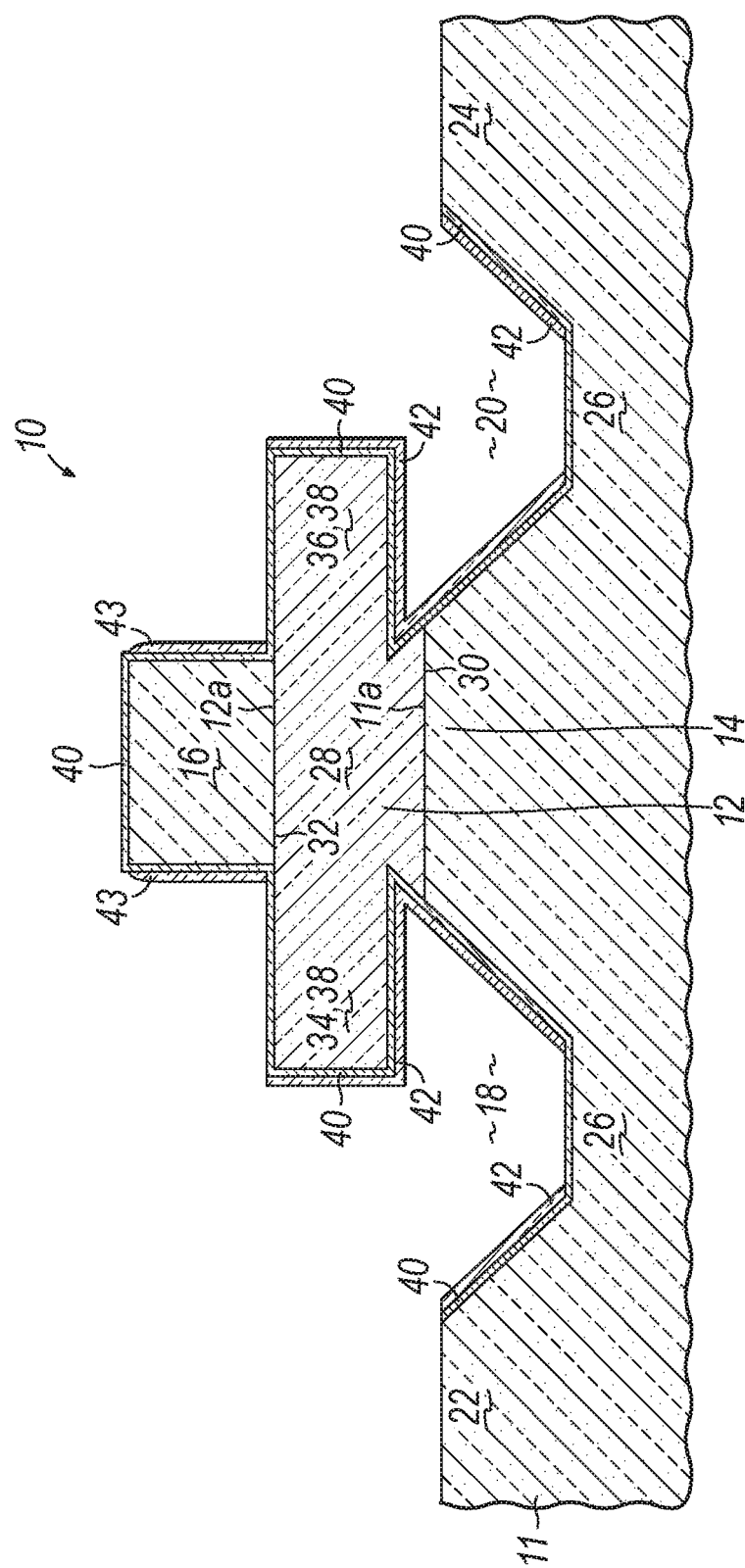
FIGS. 1-5 are cross-sectional views of a portion of a substrate at successive fabrication stages of a processing method for fabricating a device structure in accordance with an embodiment.

With reference to FIG. 1 and in accordance with an embodiment of the invention, a bipolar junction transistor 10 is fabricated using a substrate 11. The substrate 11 comprises a single-crystal semiconductor material usable to form the devices of an integrated circuit. For example, the substrate 11 may be comprised of a wafer of a monocrystalline silicon-containing material, such as a single-crystal silicon wafer, or a device layer of a silicon-on-insulator wafer. The semiconductor material constituting the substrate 11 may comprise an electrically-active dopant that alters its electrical properties and may also include an optional epitaxial layer at its top surface 11a. The substrate 11 may comprise an n-type dopant from Group V of the Periodic Table (e.g., phosphorus (P), arsenic (As), or antimony (Sb)) in a concentration that is effective to impart n-type conductivity.

A base layer 12 of the bipolar junction transistor 10 is located on the top surface 11a of substrate 11. The base layer 12 may be comprised of a different semiconductor material than the collector 14 and may have an opposite conductivity type from the collector 14. The base layer 12 may be comprised of a semiconductor material, such as silicon-germanium (SiGe) in an alloy with a content of silicon (Si) ranging from 95 atomic percent to 50 atomic percent and a content of germanium (Ge) ranging from 5 atomic percent to 50 atomic percent. The germanium content of the base layer 12 may be uniform across the thickness of base layer 12 or graded and/or stepped across the thickness of base layer 12. The semiconductor material of the base layer 12 may comprise a dopant, such as a p-type dopant selected from Group III of the Periodic Table (e.g., boron) in a concentration that is effective to impart p-type conductivity and, optionally, carbon (C) to suppress the outdiffusion of the p-type dopant. The base layer 12 may be formed from a semiconductor material layer deposited using a low temperature epitaxial (LTE) growth process, such as vapor phase epitaxy (VPE).

An emitter 16 of the bipolar junction transistor 10 is located on a top surface 12a of the base layer 12. The emitter 16 may be comprised of a different semiconductor material than the base layer 12 and may have an opposite conductivity type from the base layer 12. For example, the emitter 16 may lack germanium that is present in at least a portion of the base layer 12. In a representative embodiment, the emitter 16 may be comprised of a semiconductor material, such as silicon, deposited by chemical vapor deposition (CVD) and may be doped with a concentration of an n-type dopant selected from Group V of the Periodic Table (e.g., phosphorus (P) or arsenic (As)) in a concentration that is effective to impart n-type conductivity.

Trenches 18, 20 extend to a shallow depth beneath the top surface 11a of the substrate 11 and may establish boundaries for a collector 14 and collector contacts 22, 24 that are located beneath the top surface 11a of the substrate 11. The trenches 18, 20 may be formed by wet chemical etching process, a dry etching process (e.g., reactive-ion etching (RIE)), or a combination of these etching processes conducted in one or more steps using one or more etch chemistries. The trenches 18, 20 are subsequently used to form trench isolation regions.

The collector 14 may be comprised of a section of the material of the substrate 11 located between the trenches 18, 20 and may contain a concentration of an n-type dopant in a concentration that is effective to impart n-type conductivity. The dopant concentration of the collector 14 may be elevated to enhance its electrical conductivity by ion implantation or the growth of a doped epitaxial layer at the top surface 11a of the substrate 11. The collector contacts 22, 24 are separated from the collector 14 by the trenches 18, 20. A sub-collector 26 extends laterally from the collector 14 beneath the trenches 18, 20 to couple the collector 14 with the collector contacts 22, 24. The collector contacts 22, 24 and sub-collector 26 are also comprised of the semiconductor material of the substrate 11 and have the same conductivity type as the semiconductor material comprising the collector 14.

The bipolar junction transistor 10 is characterized by a vertical architecture that includes the emitter 16, the collector 14, and an intrinsic base 28 defined by a central section of the base layer 12 that is positioned between the emitter 16 and collector 14. The intrinsic base 28 is coextensive with the collector 14 along a junction 30, and the emitter 16 is coextensive with the intrinsic base 28 along another junction 32. Sections 34, 36 of the base layer 12, which are peripheral to the intrinsic base 28, may collectively define an extrinsic base 38 that is coupled with the intrinsic base 28. In the representative device structure, the sections 34, 36 of the base layer 12 defining the extrinsic base 38 at least partially overhang the trenches 18, 20 and the trench isolation regions subsequently formed in the trenches 18, 20. The bipolar junction transistor 10 may be characterized as a heterojunction bipolar transistor (HBT) if two or all three of the collector 14, the emitter 16, and the intrinsic base 28 are comprised of semiconductor materials with different bandgaps.

A dielectric layer 40 is located on the exposed surfaces of the base layer 12, the emitter 16, and the substrate 11, and a dielectric layer 42 is located on the dielectric layer 40. The dielectric layers 40, 42 may be comprised of different electrical insulator characterized by a dielectric constant (e.g., a permittivity) characteristic of a dielectric material. In one embodiment, the dielectric layer 40 may be comprised of silicon dioxide ($SiO_2$) deposited using a rapid thermal process or formed by thermal oxidation, and dielectric layer 42 may be comprised of an electrical insulator, such as silicon nitride ($Si_3N_4$), that is conformally deposited by chemical vapor deposition. A directional anisotropic etching process, such as RIE, is used to preferentially remove the dielectric layer 42 from horizontal surfaces, such as the top surface 12a of the base layer 12, and partially horizontal surfaces, such as the inclined surfaces inside the trenches 18, 20. The preferential removal uncovers sections of the dielectric layer 40, such as sections of the dielectric layer 40 on top surface 12a of the base layer 12 and, in particular, on the sections 34, 36 of the base layer 12 defining the extrinsic base 38. Spacers 42 are formed from the dielectric layers 40, 42 on the vertical sidewalls of the emitter 16 by the preferential removal of the dielectric layer 42.

Figure 2:
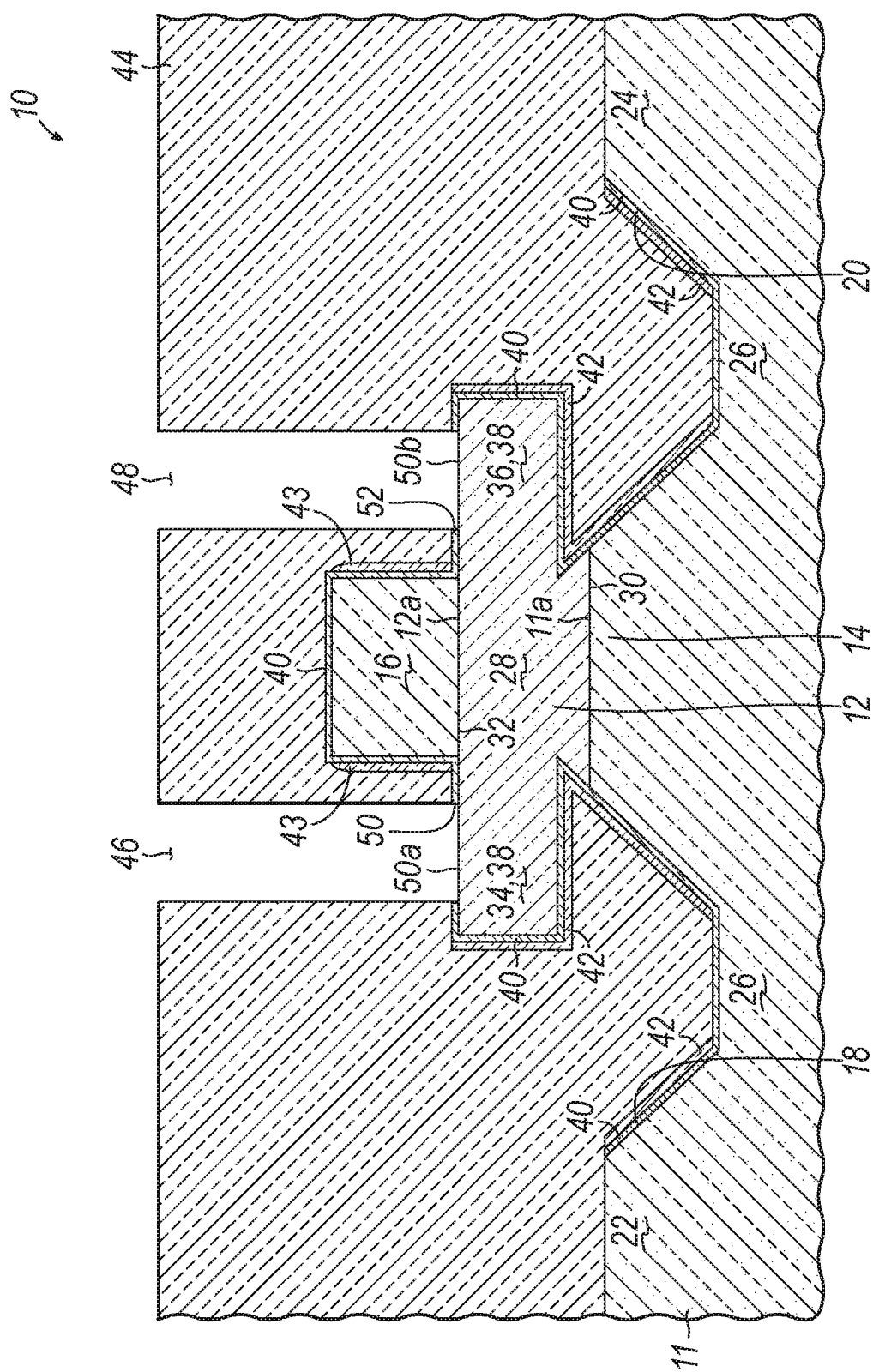

With reference to FIG. 2 in which like reference numerals refer to like features in FIG. 1 and at a subsequent fabrication stage of the processing method, the sections 34, 36 of the base layer 12 defining the extrinsic base 38 are not covered by the emitter 16 and the spacers 42, and project laterally from the intrinsic base 28 that is covered by the emitter 16 and the spacers 42. These sections 34, 36, which are used to contact the covered intrinsic base 28, may be modified to increase their electrical conductivity without the necessity for an ion implantation process.

To that end, a mask layer 44 may be applied to a top surface of the substrate 11. The mask layer 44 may comprise, for example, a photoresist that is applied with a spin coating process, pre-baked, exposed to a radiation projected through a photomask, baked after exposure, and developed with a chemical developer to define a pattern with openings 46, 48. An etching process may be used to remove the dielectric layer 40 from the top surface 12a of the base layer 12 at positions consistent with the pattern of openings 46, 48 to define windows 50, 52 in the dielectric layer 40. The etching process may comprise a wet chemical etch or a dry etch, and may rely on a given etch chemistry. The windows 50, 52 in the dielectric layer 40 expose respective surface areas on the top surface 12a of the base layer 12 and, more specifically, exposed surface areas on the sections 34, 36 of the base layer 12 defining the extrinsic base 38. These exposed surface areas on the sections 34, 36 of the base layer 12 are accessible during subsequent processing stages for increasing the electrical conductivity of the extrinsic base 38.

Figure 3:
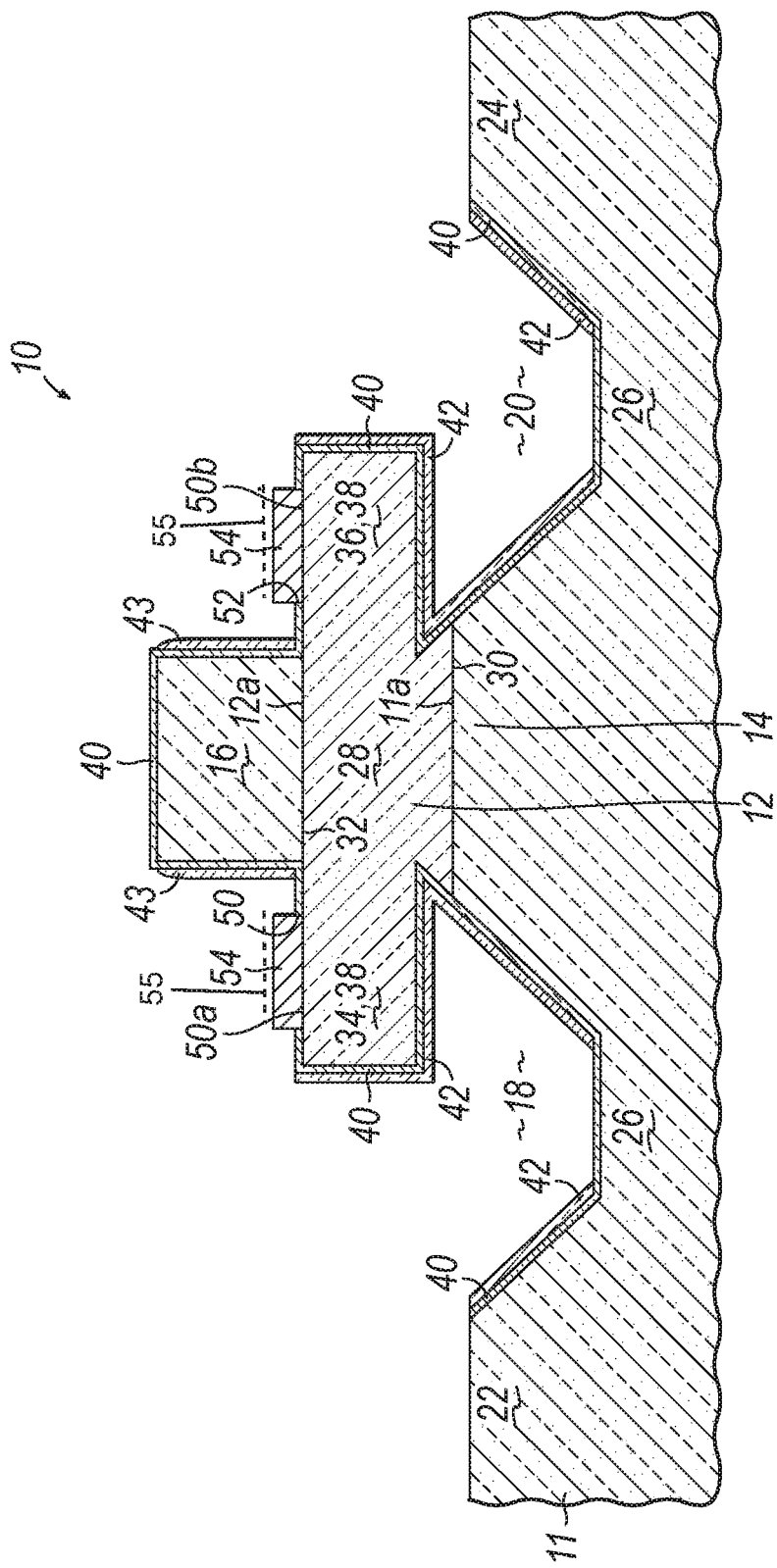

With reference to FIG. 3 in which like reference numerals refer to like features in FIG. 2 and at a subsequent fabrication stage of the processing method, the mask layer 44 may be removed following the etching process. If comprised of a photoresist, the mask layer 44 may be removed by ashing or solvent stripping, followed by a conventional cleaning process.

A layer 54 is deposited on the top surface 12a of the base layer 12 at locations coinciding with the exposed surface areas inside of windows 50, 52 in the dielectric layer 40. The dielectric layer 40 functions as a hardmask during the deposition. The layer 54 contains a dopant that can be introduced into the semiconductor material of the sections 34, 36 of the base layer 12 defining the extrinsic base 38 and activated to elevate the electrical conductivity. In an embodiment, the dopant contained in the layer 54 may comprise a p-type dopant selected from Group III of the Periodic Table (e.g., boron (B), gallium (Ga) or both) in a concentration that is effective to impart p-type conductivity concentration. The attributes of the layer 54, such as thickness, may be selected to add a targeted concentration of the dopant to all or part of the sections 34, 36 of the base layer 12. In an embodiment, the dopant-containing layer 54 may have a thickness on the order of 1 nanometer to 10 nanometers when deposited, and the diffused length of the dopant from the dopant-containing layer 54 into the base layer 12 during the subsequent annealing is greater this original thickness In a specific embodiment, the layer 54 may be comprised of elemental boron deposited in a solid phase by chemical vapor deposition using diborane ($B_2H_6$) as the gas source and hydrogen ($H_2$) or nitrogen ($N_2$) as the carrier gas. The deposition may be conducted at either atmospheric pressure or at a reduced pressure for deposition temperatures ranging from 400° C. to 800° C. The elemental boron in the layer 54 may be in an amorphous state. Through the selection of the deposition conditions, the boron from the gas source primarily deposits as the layer 54 and negligible diffusion occurs into the semiconductor material of the base layer 12. For embodiments in which the deposition of the layer 54 is selective, boron atoms do not adsorb as a distinct layer on the material constituting the dielectric layer 40. However, layer 54 deposits on the dielectric-free surface areas of the top surface 12a inside the windows 50, 52.

In an alternative embodiment, the layer 54 may be comprised of elemental gallium deposited using trimethylgallium as a gas source and selected deposition conditions during chemical vapor deposition. In an alternative embodiment, the layer 54 may be comprised of a combination of elemental gallium and elemental boron in the form, for example, of a bilayer, such as a gallium layer capped by a boron layer.

Figure 4:
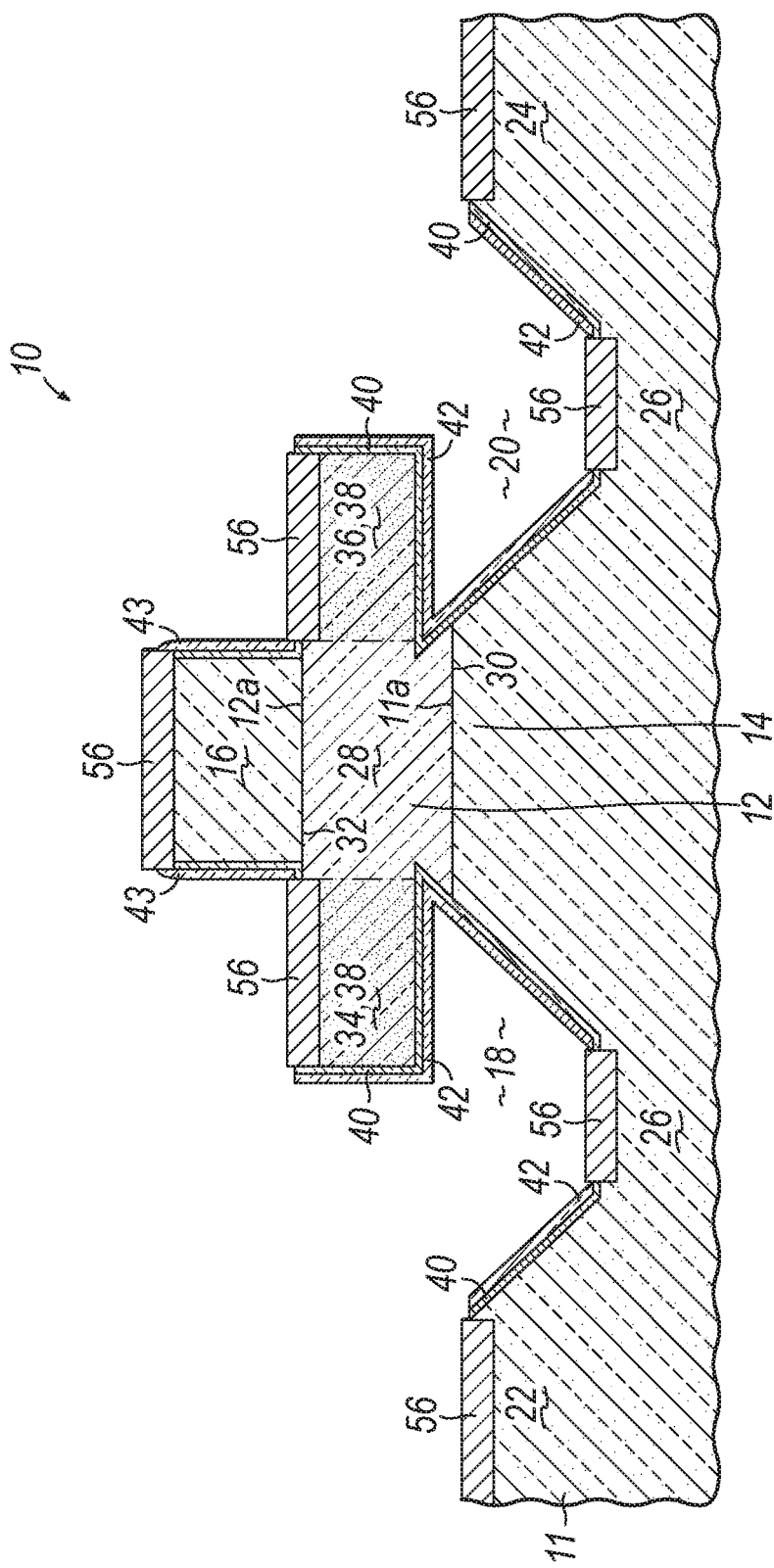

With reference to FIG. 4 in which like reference numerals refer to like features in FIG. 3 and at a subsequent fabrication stage of the processing method, the dielectric layer 40 is removed from the horizontal surfaces to expose the portion of the top surface 12a of the base layer 12 not covered by layer 54, the top surfaces of the collector contacts 22, 24, and the top surface of the emitter 16. A silicide layer 56 is formed on the top surface 12a of the base layer 12 that includes the dopant-containing layer 54 and may be subsequently used in the process flow to contact the extrinsic base 38.

The silicide layer 56 may be formed by a silicidation process that involves one or more annealing steps to form a silicide phase by reacting a metal layer 55 (FIG. 3) comprised of silicide-forming metal and the semiconductor material contacting the silicide-forming metal. The metal layer 55 may be deposited by, for example, a chemical vapor deposition or physical vapor deposition. The metal layer 55 is located on the dopant-containing layer 54 and adjacent to the semiconductor material of the base layer 12 with which the metal layer 55 is reacted. Candidate refractory metals for the silicide-forming metal include, but are not limited to, titanium (Ti), cobalt (Co), and nickel (Ni). A capping layer comprised of a metal nitride, such as sputter-deposited titanium nitride (TiN), may be applied to cap the metal layer 55.

In a representative silicidation process that involves multiple annealing steps, an initial annealing step may form a metal-rich silicide that consumes the silicide-forming metal and then form silicides of lower metal content that grow by consuming the metal-rich silicides. For example, the initial annealing step may be conducted by heating the silicide-forming metal utilizing rapid thermal annealing (RTA) at an annealing temperature, which may be contingent on the type of refractory metal, of about 400° C. to about 900° C. Following the initial annealing step, any non-converted silicide-forming metal and the optional capping layer may be removed with, for example, one or more wet chemical etches. The silicide layer 56 may then be subjected to an additional annealing step to form a lower-resistance silicide phase. The annealing temperature of the additional annealing step may be greater than the annealing temperature of the initial annealing step.

During the formation of the silicide, the dopant comprising the dopant-containing layer 54 may be thermally driven by diffusion into the sections 34, 36 of the base layer 12 defining the extrinsic base 38 by the annealing steps. The dopant may be activated by a thermal process, such as the thermal process provided by the annealing steps of the silicidation process, to increase the electrical conductivity (i.e., lower the electrical resistivity) of the extrinsic base 38 by increasing the concentration of the dopant of its constituent semiconductor material. The increase in dopant concentration is relative to the original dopant concentration in the base layer 12 and remaining in the intrinsic base 28 after the silicide formation. The diffused length of the dopant into the base layer 12 is greater than the original thickness of the dopant-containing layer 54. Alternatively, a separate annealing process may be used to cause dopant diffusion from the dopant-containing layer 54 into the extrinsic base 38.

The doping of the sections 34, 36 of the base layer 12 may promote low contact resistance with the extrinsic base 38 and low base resistance, as well as increase the gain (i.e., beta) of the bipolar junction transistor 10. The doping of the extrinsic base 38 is accomplished without the use of ion implantation, which could also unwantedly dope a top portion of the emitter 16 with dopant of the opposite conductivity type, and only with the use of one additional mask. The intrinsic base 28 and the extrinsic base 38 are formed from the same base layer 12 formed by epitaxial growth. However, additional dopant added to the extrinsic base 38 through the introduction of the dopant-containing layer 54 into the intermediate device structure is in addition to any dopant provided in-situ during growth.

Sections of the silicide layer 56 are also formed by the silicidation process on the collector contacts 22, 24 and may be subsequently used in the process flow to contact the collector 14. A section of the silicide layer 56 is also formed by the silicidation process on the top surface of the emitter 16 and may be subsequently used in the process flow to contact the emitter 16. Sections of the silicide layer 56 are formed by the silicidation process inside the trenches 18, 20.

Figure 5:
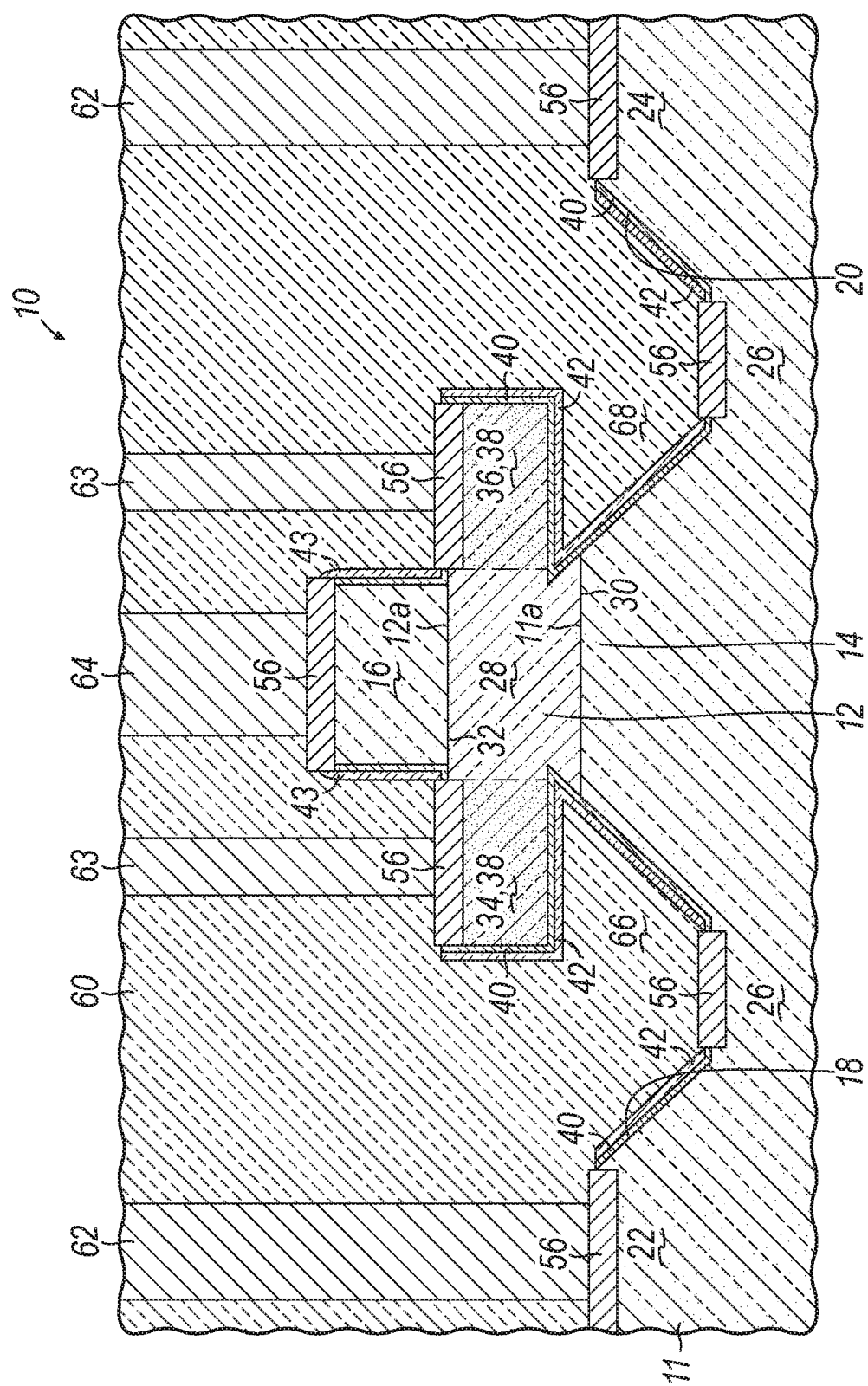

With reference to FIG. 5 in which like reference numerals refer to like features in FIG. 4 and at a subsequent fabrication stage of the processing method, middle-of-line (MOL) processing, which includes formation of a dielectric layer 60, contacts 62, 63, 64, and wiring, follows to define a local interconnect structure. Contacts 62 are coupled with the collector contacts 22, 24, contacts 63 are coupled with the extrinsic base 38, and contacts 64 are coupled with the emitter 16. Candidate inorganic dielectric materials for the dielectric layer 60 may include, but are not limited to, borophosphosilicate glass (BPSG), silicon dioxide ($SiO_2$), silicon nitride ($Si_3N_4$), fluorine-doped silicon glass (FSG), and combinations of these and other dielectric materials. Dielectric layer 60 may be deposited by any number of techniques including, but not limited to, sputtering, spin-on application, or CVD. Portions of the dielectric layer 60 may at least partially fill the trenches 18, 20 to define trench isolation regions 66, 68 that laterally flank the collector 14.

Back-end-of-line (BEOL) processing follows, which includes formation of additional dielectric layers, via plugs, and wiring for an interconnect structure coupled with the local interconnect structure with the bipolar junction transistor 10, as well as other similar contacts for additional device structures like bipolar junction transistor 10 and CMOS transistors that may be included in other circuitry fabricated on the substrate 11.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device structure for a bipolar junction transistor, the device structure comprising:
   a substrate including:
      a collector portion;
      a first collector contacts portion and a second collector contacts portion on opposing sides of the collector portion;
      a first sub-collector portion extending laterally from the collector portion to couple the collector portion with the first collector contacts portion;
      a second sub-collector portion extending laterally from the collector portion to couple the collector portion with the second collector contacts portion; and
      a first silicide layer, a second silicide layer, a third silicide layer, and a fourth silicide layer over the first collector contacts portion, the second collector contacts Portion, the first sub-collector portion, and the second sub-collector portion, respectively;
   a base layer disposed on a top surface of the substrate over the collector portion, the base layer comprised of a semiconductor material;
   an emitter portion on a top surface of the base layer;
   a fifth silicide layer on a top surface of the emitter portion;
   a first dielectric layer on portions of surfaces of the base layer and on adjacent surfaces of the emitter portion;
   a second dielectric layer on the first dielectric layer;
   a first trench isolation region adjacent to a first portion of the base layer, the first portion of the base layer is disposed adjacent a first side of the emitter portion; and
   a second trench isolation region adjacent to a second portion of the base layer, the second portion of the base layer is disposed adjacent a second side of the emitter portion, and the first trench isolation region and the second trench isolation region are filled with a third dielectric layer.

2. The device structure of claim 1, further comprising:
   a sixth silicide layer over a first top surface portion of the base layer; and
   a seventh silicide layer over a second top surface portion of the base layer.

3. The device structure of claim 1, wherein the emitter portion and the collector portion comprise semiconductor materials with different bandgaps.

4. The device structure of claim 1, wherein the emitter portion is coupled with first contacts.

5. The device structure of claim 4, wherein the first collector contacts portion is coupled with second contacts, and the second collector contacts portion is coupled with third contacts.

6. The device structure of claim 5, wherein the first sub-collector portion is coupled with fourth contacts, and the second sub-collector portion is coupled with fifth contacts.

7. The device structure of claim 1, wherein the third dielectric layer comprises one of borophosphosilicate glass (BPSG), silicon dioxide ($SiO_2$), silicon nitride ($Si_3N_4$), fluorine-doped silicon glass (FSG), or a combination thereof.

8. The device structure of claim 1, wherein the collector portion is disposed between the first trench isolation region and the second trench isolation region, and the first trench isolation region and the second trench isolation region establish boundaries for the collector portion.

* * * * *